United States Patent
Yoshikawa et al.

(10) Patent No.: US 9,574,270 B2
(45) Date of Patent: Feb. 21, 2017

(54) PLASMA PROCESSING APPARATUS

(71) Applicant: TOKYO ELECTRON LIMITED, Tokyo (JP)

(72) Inventors: Jun Yoshikawa, Miyagi (JP); Michitaka Aita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/605,338

(22) Filed: Jan. 26, 2015

(65) Prior Publication Data

US 2015/0211125 A1   Jul. 30, 2015

(30) Foreign Application Priority Data

Jan. 28, 2014 (JP) ................................ 2014-013480

(51) Int. Cl.
| | |
|---|---|
| *C23C 16/00* | (2006.01) |
| *C23F 1/00* | (2006.01) |
| *H01L 21/306* | (2006.01) |
| *C23C 16/511* | (2006.01) |
| *C23C 16/34* | (2006.01) |
| *H01J 37/32* | (2006.01) |

(52) U.S. Cl.
CPC .......... *C23C 16/511* (2013.01); *C23C 16/345* (2013.01); *H01J 37/3222* (2013.01); *H01J 37/32192* (2013.01)

(58) Field of Classification Search
USPC ............. 118/723 MW, 715–733; 156/345.41
See application file for complete search history.

(56) References Cited

U.S. PATENT DOCUMENTS

| | | | | |
|---|---|---|---|---|
| 2003/0168436 A1* | 9/2003 | Ohmi | .................. | H01J 37/3222 |
| | | | | 219/121.43 |
| 2003/0173030 A1* | 9/2003 | Ishii | ...................... | B01J 19/088 |
| | | | | 156/345.48 |
| 2005/0160987 A1* | 7/2005 | Kasai | ..................... | H05B 6/705 |
| | | | | 118/723 MW |
| 2006/0118241 A1* | 6/2006 | Ohmi | ................ | H01J 37/32192 |
| | | | | 156/345.41 |

FOREIGN PATENT DOCUMENTS

| | | |
|---|---|---|
| JP | 2002-93788 A | 3/2002 |
| JP | 2011-77228 A | 4/2011 |

* cited by examiner

*Primary Examiner* — Rakesh Dhingra
(74) *Attorney, Agent, or Firm* — Rothwell, Figg, Ernst & Manbeck, P.C.

(57) ABSTRACT

Disclosed is provides a plasma processing apparatus that processes a workpiece. The plasma processing apparatus includes: a processing container configured to accommodate the workpiece; a coaxial waveguide configured to transmit microwaves generated in a microwave generator; and a slow wave plate configured to adjust a wavelength of the microwaves transmitted from the coaxial waveguide and to introduce the microwaves into the processing container. A lower end portion of an inner conductor of the coaxial waveguide has a tapered shape of which a diameter increases downwardly, the slow wave plate has an annular shape in a plan view, and the inner surface of the slow wave plate encloses the lower end portion of the inner conductor and is located more outside than an inner surface of an outer conductor of the coaxial waveguide in a radial direction.

4 Claims, 5 Drawing Sheets (a)

(b)

(c)

PLASMA PROCESSING APPARATUS

CROSS-REFERENCE TO RELATED APPLICATIONS

This application is based on and claims priority from Japanese Patent Application No. 2014-013480, filed on Jan. 28, 2014 with the Japan Patent Office, the disclosure of which is incorporated herein in its entirety by reference.

TECHNICAL FIELD

The present disclosure relates to a plasma processing apparatus which processes an object to be processed ("workpiece").

BACKGROUND

In the related art, a plasma processing apparatus using a radial line slot antenna has been known as a plasma processing apparatus that performs a predetermined plasma processing on a workpiece such as, for example, a semiconductor wafer. The radial line slot antenna is disposed on a ceiling opening a processing container in a state where a slow wave plate is disposed above a slot plate having a plurality of slots and is connected to a coaxial waveguide at the central portion thereof. With this configuration, microwaves generated by a microwave generator are radially transmitted in a radial direction by the slow wave plate via the coaxial waveguide, generate circular polarized waves by the slot plate, and then are radiated from the slot plate into the processing container. High density plasma having a low electron temperature may be generated in the processing container by the microwaves under a low pressure and the plasma processing such as, for example, a film forming processing or an etching processing is performed by the generated plasma.

In the plasma processing apparatus described above, for example, the coaxial waveguide 100 is configured by an inner conductor 101 and an outer conductor 102, as illustrated in FIG. 7. The lower end portion 101a of the inner conductor 101 is formed in a conical shape and has a tapered shape of which a diameter increases downwardly. Further, the slow wave plate 110 has, for example, a protrusion 110a which upwardly protrudes therein. The protrusion 110a is formed to fill a gap between the inner conductor 101 and the outer conductor 102 and suppresses an axial deviation in a radial direction of the coaxial waveguide 100.

However, since the protrusion 110a in the slow wave plate 110 is hard to process, minute air layers 111 are generated between the protrusion 110a and the inner conductor 101 or between the protrusion 110a and the outer conductor 102. Thus, the transmission path of the microwaves becomes a complicated space. Further, the air layers 111 may become different from each other depending on a machine difference between apparatuses. Then, the microwaves are not appropriately transmitted from the coaxial waveguide 100 to the slow wave plate 110, and as a result, the circumferential radiation of the microwaves in the slow wave plate 110 becomes non-uniform.

From this point, for example, Japanese Patent Laid-Open Publication No. 2011-077228 discloses a slow wave plate 120 which does not have the protrusion 110a, as illustrated in FIG. 8. The slow wave plate 120 is configured by a small diameter circular flat plate member disposed therein and a large diameter circular flat plate member which encloses the small diameter member. FIG. 8 illustrates the small diameter member of the slow wave plate 120. The inner surface 120a of the slow wave plate 120 is located more inside than the inner surface 102a of the outer conductor 102 of the coaxial waveguide 100 in the radial direction. In other words, the slow wave plate 120 is provided to protrude toward the inner conductor 101 more than the outer conductor 102.

SUMMARY

An aspect of the present disclosure provides a plasma processing apparatus that processes a workpiece. The plasma processing apparatus includes: a processing container configured to accommodate the workpiece; a coaxial waveguide configured to transmit microwaves generated in a microwave generator; and a slow wave plate configured to adjust a wavelength of the microwaves transmitted from the coaxial waveguide and to introduce the microwaves into the processing container. A lower end portion of an inner conductor of the coaxial waveguide has a tapered shape of which a diameter increases downwardly, the slow wave plate has an annular shape in a plan view, and the inner surface of the slow wave plate encloses the lower end portion of the inner conductor and is located more outside than an inner surface of an outer conductor of the coaxial waveguide in a radial direction. In a figure illustrating an emissivity of the microwaves transmitted from the coaxial waveguide to the slow wave plate and calculated using the horizontal length and the vertical length of a tapered shape in the lower end portion of the internal conductor as parameters, the slow wave plate has an inner diameter determined such that an area of the parameters where the emissivity is equal to or higher than a predetermined emissivity becomes a maximum area.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 6A to 6C illustrate emissivities of microwaves which are results of the simulation, in which FIG. 6A illustrates the emissivity of microwaves when the inner diameter of a slow wave plate is 50 mm, FIG. 6B illustrates the emissivity of microwaves when the inner diameter of the slow wave plate is 60 mm, and FIG. 6C illustrates the emissivity of microwaves when the inner diameter of the slow wave plate is 70 mm.

DETAILED DESCRIPTION

In the following detailed description, reference is made to the accompanying drawings, which form a part hereof. The illustrative embodiments described in the detailed description, drawing, and claims are not meant to be limiting. Other exemplary embodiments may be utilized, and other changes may be made, without departing from the spirit or scope of the subject matter presented here.

Figure 7:
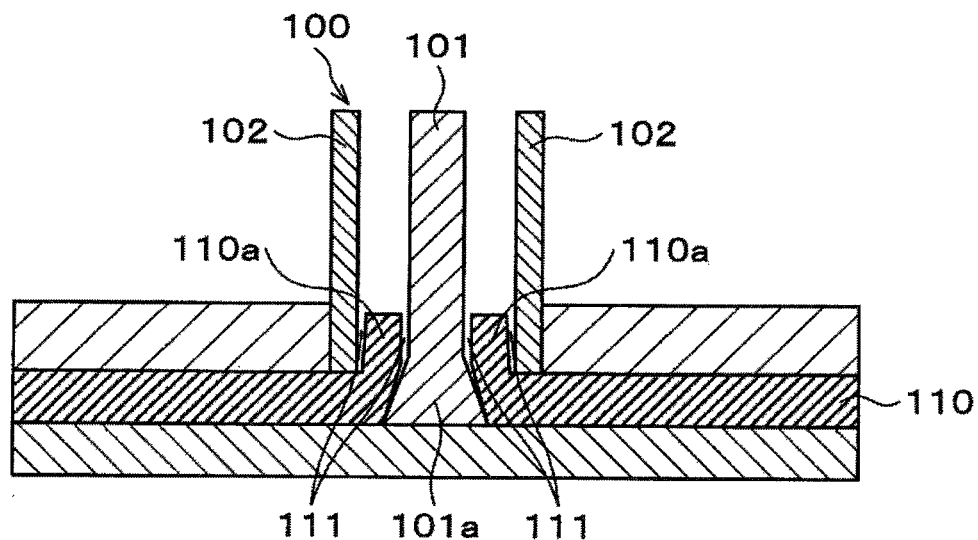
FIG. 7 is a vertical cross-sectional view schematically illustrating configurations of a coaxial waveguide and a slow wave plate of the related art.
Figure 8:
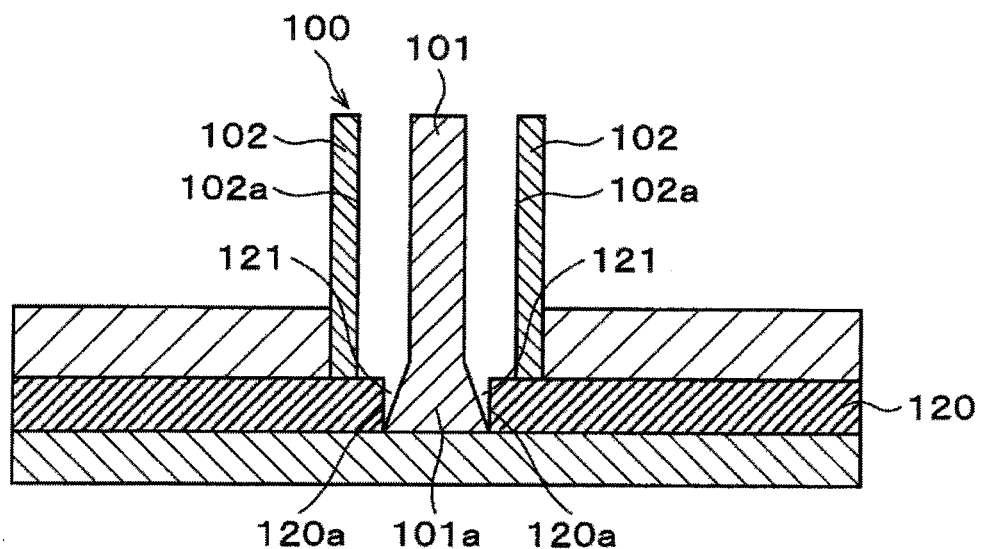
FIG. 8 is a vertical cross-sectional view schematically illustrating configurations of a coaxial waveguide and a slow wave plate of the related art.

When the slow wave plate 120 disclosed in Japanese Patent Laid-Open Publication No. 2011-077228 is used, the air layers 111 generated by the protrusion 110a illustrated in FIG. 7 may be removed but a minute air layer 121 is formed between the inner surface 120a of the slow wave plate 120 and the lower end portion 101a of the inner conductor 101 as illustrated in FIG. 8. That is, even if the slow wave plate 120 is used, the transmission path of the microwave becomes a complicated space. Therefore, some of the microwaves transmitted through the inside of the coaxial waveguide 100 are directly transmitted to the slow wave plate 120 but the remaining microwaves are transmitted to the slow wave plate 120 via the minute air layer 121. Thus, the microwaves are not appropriately transmitted from the coaxial waveguide 100 to the slow wave plate 120. Then, the circumferential radiation of microwaves in the slow wave plate 120 becomes non-uniform. Further, when the radiation of microwaves becomes non-uniform, an electric field is disturbed and the density of plasma generated in the processing container becomes non-uniform.

The present disclosure has been made in an effort to uniformly radiate microwaves transmitted from a coaxial waveguide to a slow wave plate in a circumferential direction in the slow wave plate and appropriately perform a plasma processing using the microwaves.

To solve the object described above, an aspect of the present disclosure provides a plasma processing apparatus that processes a workpiece. The plasma processing apparatus includes: a processing container configured to accommodate the workpiece; a coaxial waveguide configured to transmit microwaves generated in a microwave generator; and a slow wave plate configured to adjust a wavelength of the microwaves transmitted from the coaxial waveguide and to introduce the microwaves into the processing container. A lower end portion of an inner conductor of the coaxial waveguide has a tapered shape of which a diameter increases downwardly, the slow wave plate has an annular shape in a plan view, and the inner surface of the slow wave plate encloses the lower end portion of the inner conductor and is located more outside than an inner surface of an outer conductor of the coaxial waveguide in a radial direction. In a figure illustrating an emissivity of the microwaves transmitted from the coaxial waveguide to the slow wave plate and calculated using the horizontal length and the vertical length of a tapered shape in the lower end portion of the internal conductor as parameters, the slow wave plate has an inner diameter determined such that an area of the parameters where the emissivity is equal to or higher than a predetermined emissivity becomes a maximum area.

According to the present disclosure, the inner surface of the slow wave plate encloses the lower end portion of the inner conductor and is located more outside than the inner surface of the outer conductor in a radial direction. Thus, the slow wave plate is not disposed in a gap between the inner surface of the slow wave plate and a lower end portion of the inner conductor unlike the related art and even a minute air layer is not formed. Further, the gap between the lower end portion of the inner conductor and the outer conductor is formed only by the air layer and the transmission path of the microwave is simplified from the air layer to the slow wave plate. In this case, the microwaves transmitted through the inside of the coaxial waveguide are appropriately transmitted to the slow wave plate by the tapered shape of the lower end portion of the inner conductor in the lower end portion of the coaxial waveguide and the flow of the microwaves is not disturbed. Therefore, the microwaves may be uniformly radiated in the circumferential direction in the slow wave plate. Further, since the microwaves are uniformly radiated, an electric field formed by the energy of the microwaves is not disturbed. Thus, the density of plasma generated in the processing container becomes uniform and thus plasma processing may be appropriately performed.

As a result of the inventors' thorough review, it has been found that even when the axial deviation of the coaxial waveguide occurs in the radial direction with respect to the slow wave plate, the microwave may be uniformly radiated in the circumferential direction in the slow wave plate when the slow wave plate of the present disclosure is used. Specifically, a simulation was performed while setting the axial deviation of the coaxial waveguide to a maximum value allowed by design and it has been found that the microwaves are uniformly radiated in the circumferential direction in the slow wave plate.

The slow wave plate may be disposed concentrically with the inner conductor.

The inner surface of the slow wave plate may extend in an approximately vertical direction. Further, the approximately vertical direction includes not only the vertical direction but also an angle in a range of ±5° from the vertical direction.

The slow wave plate may have an inner diameter determined such that a change rate of the emissivity of microwaves with respect to the change of the size of the tapered shape in the lower end portion of the inner conductor becomes a predetermined value or less.

According to the present disclosure, the microwaves transmitted from the coaxial waveguide to the slow wave plate may be uniformly radiated in the circumferential direction in the slow wave plate and the plasma processing using the microwaves may be appropriately performed.

Figure 1:
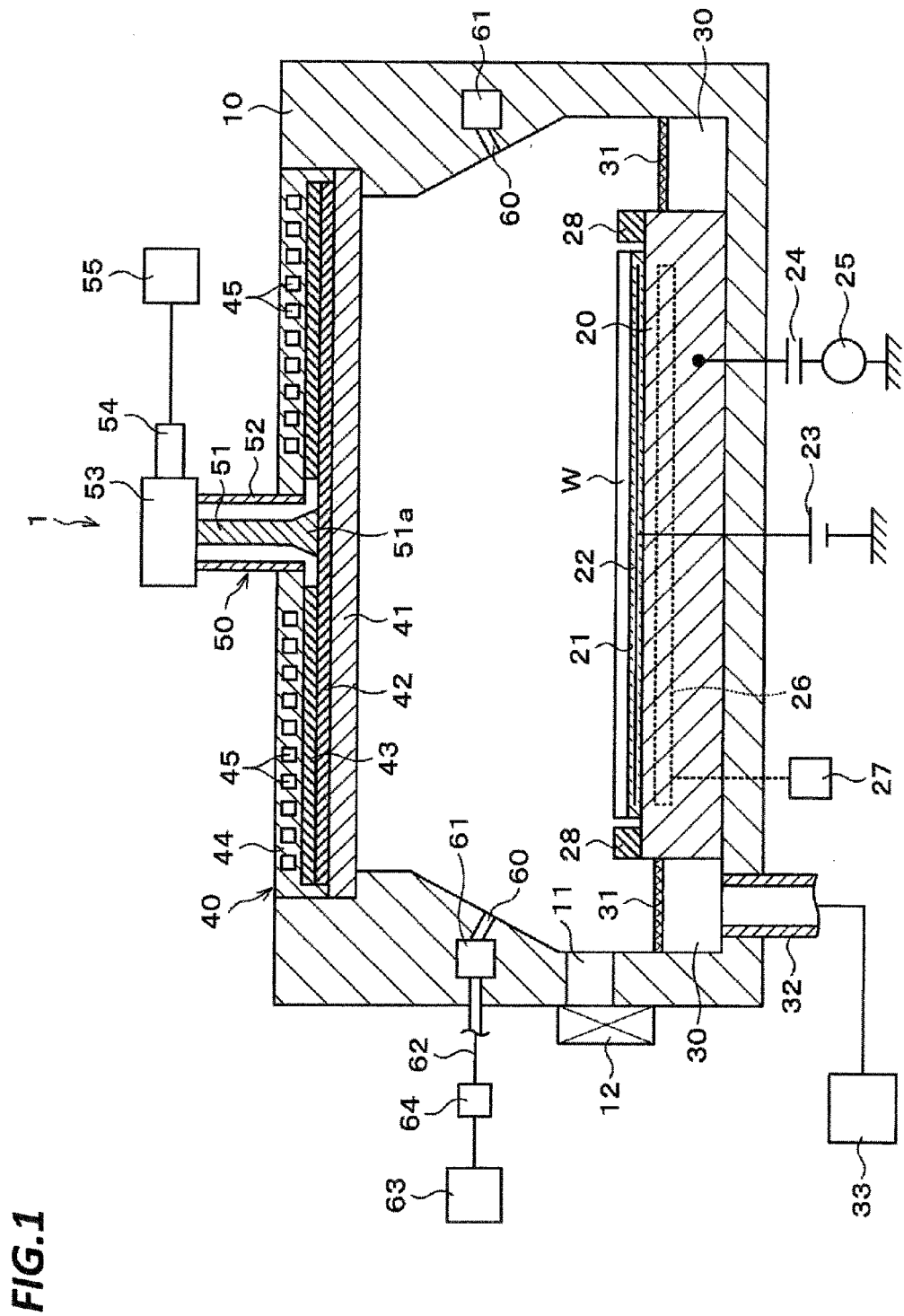
FIG. 1 is a vertical cross-sectional view schematically illustrating a configuration of a plasma processing apparatus according to an exemplary embodiment.

Hereinafter, exemplary embodiments of the present disclosure will be described in detail with reference to the accompanying drawings. FIG. 1 is a vertical cross-sectional view schematically illustrating a configuration of a plasma processing apparatus 1 according to an exemplary embodiment. In the specification and drawings, components having substantially the same functional configurations will be denoted by the same reference numerals and a redundant description will be omitted. Further, in the plasma processing apparatus 1 according to the present exemplary embodiment, a plasma chemical vapor deposition (CVD) processing is performed on a surface of a wafer W as a workpiece and a silicon nitride film (SiN film) is formed on the surface of the wafer W.

The plasma processing apparatus 1 includes a processing container 10 as illustrated in FIG. 1. The processing container 10 has an approximately cylindrical shape of which the ceiling is open and a radial line slot antenna 40 to be described below is disposed in the opening of the ceiling.

Further, a carry in/out port 11 of a wafer W is formed on a side of the processing container 10 and a gate valve 12 is provided in the carry in/out port 11. The processing container 10 is configured to be capable of sealing the inside thereof. Further, a metal such as, for example, aluminum or stainless steel, is used for the processing container 10, and the processing container 10 is grounded.

A mounting table 20, on which the wafer W is mounted, is provided on the bottom of the processing container 10. The mounting table 20 has a cylindrical shape and aluminum is used for the mounting table 20.

An electrostatic chuck 21 is provided on the top surface of the mounting table 20. The electrostatic chuck 21 has a configuration with an electrode 22 sandwiched between insulating materials. The electrode 22 is connected to a direct current (DC) power supply 23 which is provided outside the processing container 10. Coulomb force is generated on a surface of the mounting table 20 by the DC power supply 23 so as to electrostatically attract the wafer W onto the mounting table 20.

A high frequency power supply 25 for RF bias may be connected to the mounting table 20 via a capacitor 24. The high frequency power supply 25 outputs high frequency waves having a predetermined frequency suitable for controlling energy of ions which are drawn into the wafer W, for example, high frequency waves of 13.56 MHz, with a predetermined power.

A temperature adjusting mechanism 26 is provided in the mounting table 20 to circulate, for example, a cooling medium. The temperature adjusting mechanism 26 is connected to a liquid temperature adjusting unit 27 to adjust a temperature of the cooling medium. The temperature of the mounting table 20 is controlled by adjusting the temperature of the cooling medium by the liquid temperature adjusting unit 27, and as a result, the wafer W disposed on the mounting table 20 may be maintained at a predetermined temperature. Further, a gas passage (not illustrated) is formed on the mounting table 20 to supply a heat transfer medium such as, for example, He gas, onto the rear surface of the wafer W at a predetermined pressure (back pressure).

On the top surface of the mounting table 20, a circular focus ring 28 is formed to enclose the wafer W on the electrostatic chuck 21. An insulating material such as, for example, ceramic or quartz, is used for the focus ring 28 and the focus ring 28 functions to improve uniformity of the plasma processing.

An elevating pin (not illustrated) is provided below the mounting table 20 so as to elevate the wafer W while supporting the wafer W from the bottom side. The elevating pin is inserted through a through hole (not illustrated) formed in the mounting table 20 to be capable of protruding from the top surface of the mounting table 20.

A circular exhaust space 30 is formed between the mounting table 20 and the side wall of the processing container 10 around the mounting table 20. A circular baffle plate 31 is provided in the upper portion of the exhaust space 30 and a plurality exhaust holes is formed in the baffle plate 31 in order to uniformly evacuate the inside of the processing container 10. An exhaust pipe 32 is connected to the bottom of the processing container 10 serving as the bottom of the exhaust space 30. The number of exhaust pipes 32 may be arbitrarily set and a plurality of exhaust pipes may be formed in a circumferential direction. The exhaust pipe 32 is connected to, for example, an exhaust apparatus 33 including a vacuum pump. The exhaust apparatus 33 may reduce a pressure of an atmosphere in the processing container 10 to a predetermined degree of vacuum.

A radial line slot antenna 40 is provided on the opening of the ceiling of the processing container 10 to supply microwaves for plasma generation. The radial line slot antenna 40 includes a microwave transmissive plate 41, a slot plate 42, a slow wave plate 43, and a shield cover 44.

The microwave transmissive plate 41 is closely installed in the opening of the ceiling of the processing container 10 by a sealing material such as, for example, an O-ring (not illustrated). Therefore, the inside of the processing container 10 is hermetically maintained. A dielectric body such as, for example, quartz, $Al_2O_3$, or AlN, is used for the microwave transmissive plate 41 and the microwave transmissive plate 41 transmits microwaves.

The slot plate 42 serves as a top surface of the microwave transmissive plate 41 and is provided to be opposite to the mounting table 20. A plurality of slots is formed in the slot plate 42 and the slot plate 42 functions as an antenna. A conductive material such as, for example, copper, aluminum, or nickel, is used for the slot plate 42.

The slow wave plate 43 is provided on the top surface of the slot plate 42. A low loss dielectric material such as, for example, quartz, $Al_2O_3$, or AlN, is used for the slow wave plate 43 and the slow wave plate 43 shortens the wavelength of the microwaves. A detailed structure of the slow wave plate 43 will be described below.

The shield cover 44 is provided on the top surface of the slow wave plate 43 to cover the slow wave plate 43 and the slot plate 42. A plurality of annular flow passages 45 is formed in the shield cover 44 to circulate the cooling medium. The temperatures of the microwave transmissive plate 41, the slot plate 42, the slow wave plate 43, and the shield cover 44 are adjusted to a predetermined temperature by the cooling medium which flows through the flow passage 45.

A coaxial waveguide 50 is connected to a central portion of the shield cover 44. The coaxial waveguide 50 includes an inner conductor 51 and an outer conductor 52. The inner conductor 51 is connected to the slot plate 42. The lower end portion 51a of the inner conductor 51 is formed in a conical shape and has a tapered shape of which a diameter increases toward the slot plate 42. The microwaves are efficiently propagated to the slot plate 42 by the lower end portion 51a. That is, the microwaves transmitted through the inside of the coaxial waveguide 50 are reflected from the tapered lower end portion 51a and transmitted in the radial direction of the slow wave plate 43.

A mode converter 53 configured to convert microwaves into a predetermined vibration mode, a rectangular waveguide 54, and a microwave generator 55 configured to generate microwaves are connected to the coaxial waveguide 50 in this order from the coaxial waveguide 50. The microwave generator 55 generates microwaves having a predetermined frequency, for example, 2.45 GHz.

With this configuration, the microwaves generated in the microwave generator 55 are sequentially propagated to the rectangular waveguide 54, the mode converter 53, and the coaxial waveguide 50 to be supplied in the radial line slot antenna 40, compressed by the slow wave plate 43 to have a shorter wavelength, generate circular polarized waves by the slot plate 42, and then penetrate the microwave transmissive plate 41 from the slot plate 42 to be radiated into the processing container 10. A processing gas is turned into plasma by the microwaves in the processing container 10 and the plasma processing of the wafer W is performed by the plasma.

A processing gas supply tube 60 is provided in the side wall of the processing container 10. A plurality of processing gas supply tubes 60, for example, 24 processing gas supply tubes 60 are provided on a circumference of the side wall of the processing container 10 at regular intervals. An end of each processing gas supply tube 60 is opened on the side wall of the processing container 10 and the other end is connected to a buffer unit 61. The processing gas supply tubes 60 are obliquely disposed such that one end is located lower than the other end.

A buffer portion 61 is annularly provided inside the side wall of the processing container 10 and commonly provided for the plurality of processing gas supplying tubes 60. A processing gas supply source 63 is connected to the buffer portion 61 via a supply tube 62. Trisilylamine (TSA), $N_2$ gas, $H_2$ gas, and Ar gas are individually reserved in the processing gas supply source 63 as processing gases. Among them, TSA, $N_2$ gas, and $H_2$ gas are film forming raw gases of the SiN film and Ar gas is a plasma exciting gas. Further, a supply device group 64, which includes, for example, a valve or a flow rate adjusting unit which controls the flow rate of a processing gas, is provided in the supply tube 62.

Figure 2:
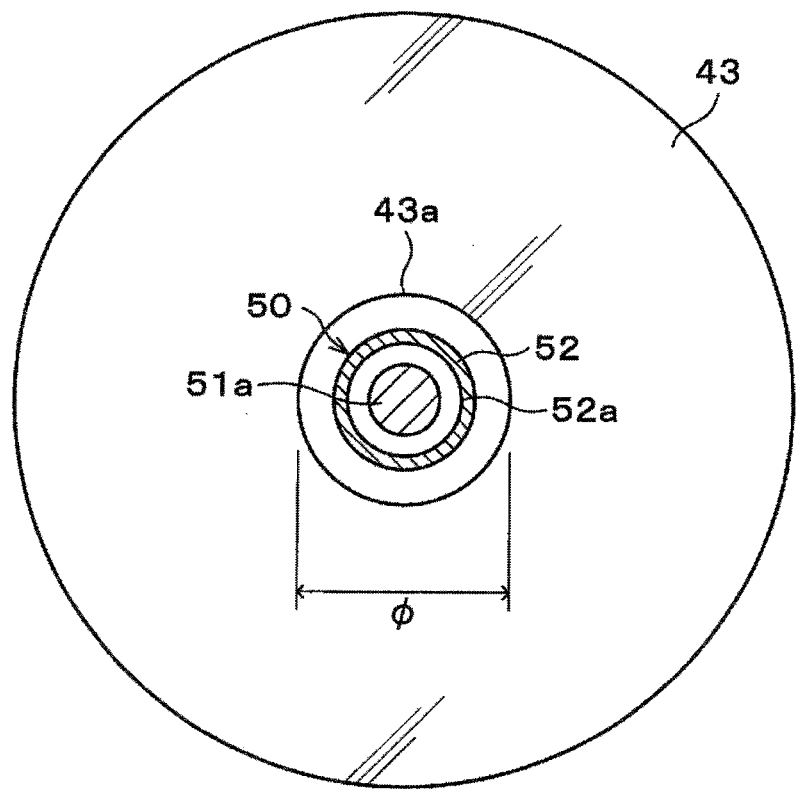
FIG. 2 is a plan view schematically illustrating a configuration of a slow wave plate.
Figure 3:
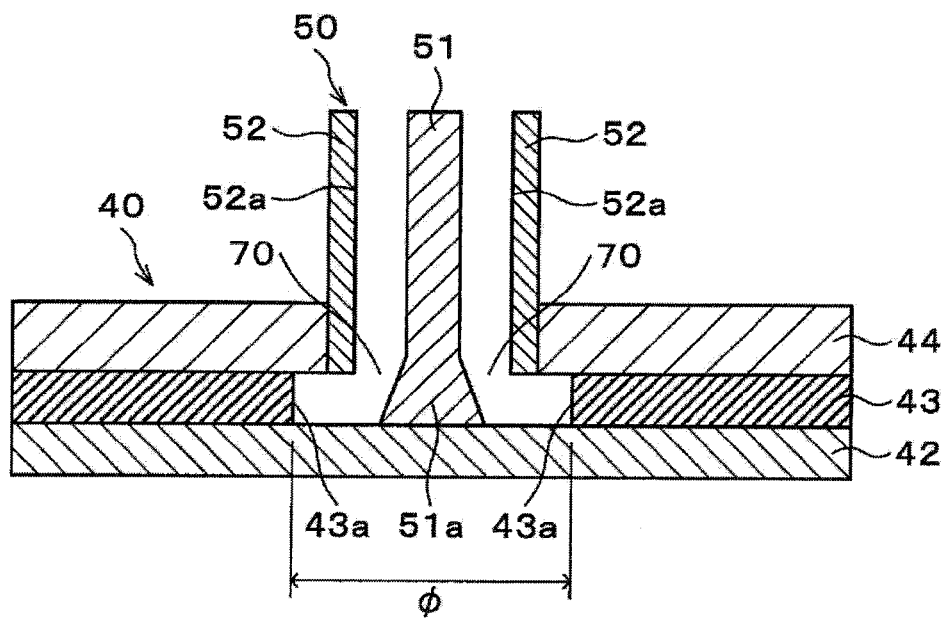
FIG. 3 is a vertical cross-sectional view schematically illustrating configurations of a coaxial waveguide and a slow wave plate.

Next, the detailed structure of the slow wave plate 43 described above will be described. As illustrated in FIG. 2, the slow wave plate 43 is a flat plate having an annular shape in a plan view. The slow wave plate 43 is disposed to be concentric with the inner conductor 51 (the lower end portion 51a). As illustrated in FIGS. 2 and 3, the inner surface 43a of the slow wave plate 43 is provided to enclose the lower end portion 51a of the inner conductor 51. Further, the inner surface 43a of the slow wave plate 43 is located more outside than the inner surface 52a of the outer conductor 52 in the radial direction. Further, the inner surface 43a of the slow wave plate 43 extends in an approximately vertical direction.

In this case, since the inner surface 43a of the slow wave plate 43 encloses the lower end portion 51a of the inner conductor 51 and is located more outside than the inner surface 52a of the outer conductor 52 in the radial direction, unlike the related art illustrated in FIGS. 7 and 8, the slow wave plates 110 and 120 are not disposed and the minute air layers 111 and 121 are not formed in the gap between the inner surface 43a of the slow wave plate 43 and the lower end portion 51a of the inner conductor 51. Further, as illustrated in FIG. 3, the gap between the lower end portion 51a of the inner conductor 51 and the outer conductor 52 is formed only by the air layer 70 and the transmission path of the microwaves is simplified from the air layer 70 to the slow wave plate 43. Then, the microwaves transmitted through the inside of the coaxial waveguide 50 are appropriately transmitted to the slow wave plate 43 by the tapered shape of the lower end portion 51a of the inner conductor 51 in the lower end portion of the coaxial waveguide 50 and thus the flow of the microwaves is not disturbed. Therefore, the circumferential radiation microwaves in a circumferential direction in the slow wave plate 43 may become uniform.

As a result of the inventors' thorough review, it has been found that even when axial deviation of the coaxial waveguide 50 occurs in the radial direction with respect to the slow wave plate 43, microwaves may be uniformly radiated in the circumferential direction in the slow wave plate 43 when the slow wave plate 43 of the present disclosure is used. Specifically, as a result of simulation of transmitting microwaves in a state where an axial deviation of the coaxial waveguide 50 is zero, the uniformity of the microwave in a circumferential direction in the slow wave plate 43 was 0.10%. The uniformity indicates a positional deviation of the microwaves in the circumferential direction with respect to the concentric circle of the slow wave plate 43 and when the axial deviation is zero, the uniformity of the microwave in the circumferential direction is theoretically zero. However, the uniformity is 0.10% due to an error of the simulation. Whereas, when the simulation was performed by changing the axial deviation of the coaxial waveguide 50 to 0.15 mm and 0.2 mm, the uniformities of the microwaves in the circumferential direction were 0.15% and 0.18%. Upon considering that a maximum allowable value of the axis deviation of the coaxial waveguide 50 on design is, for example, 0.175 mm, it is understood that even if the coaxial waveguide 50 is axially deviated in the radial direction with respect to the slow wave plate 43, microwaves are uniformly radiated in the circumferential direction in the slow wave plate 43. Further, in this simulation, in order to appropriately determine the effect of the slow wave plate 43, the slot plate 42 was omitted so as to simplify a simulation model.

In the related art, it is believed that when the coaxial waveguide is axially deviated, stationary waves of microwaves in the inside of the slow wave plate and stationary waves in the outside of the slow wave plate non-uniformly interfere with each other and as a result, deviation of microwaves in the circumferential direction in the slow wave plate is caused. Whereas, when the slow wave plate 43 of the present exemplary embodiment is used, the effects of the stationary waves in the inside of the slow wave plate 43 is suppressed, so that the slow wave plate 43 may be robust with respect to the axial deviation of the coaxial waveguide 50. That is, as described above, even when the coaxial waveguide 50 is axially deviated, microwaves may be uniformly radiated in the circumferential direction in the slow wave plate 43.

The inventors performed a simulation by setting the axial deviation of the coaxial waveguide 100 to 0.15 mm in the case where the protrusion 110a is formed in the conventional slow wave plate 110 as illustrated in FIG. 7. As a result of the simulation, the uniformity of the microwaves in the circumferential direction was 0.43%. That is, in the related art, when the coaxial waveguide 100 is axially deviated, the circumferential radiation of microwaves in the slow wave plate 110 becomes non-uniform. Therefore, from this point of view, it can be understood that the slow wave plate 43 of the present exemplary embodiment is effective to uniformly radiate the microwave in the circumferential direction.

Figure 4:
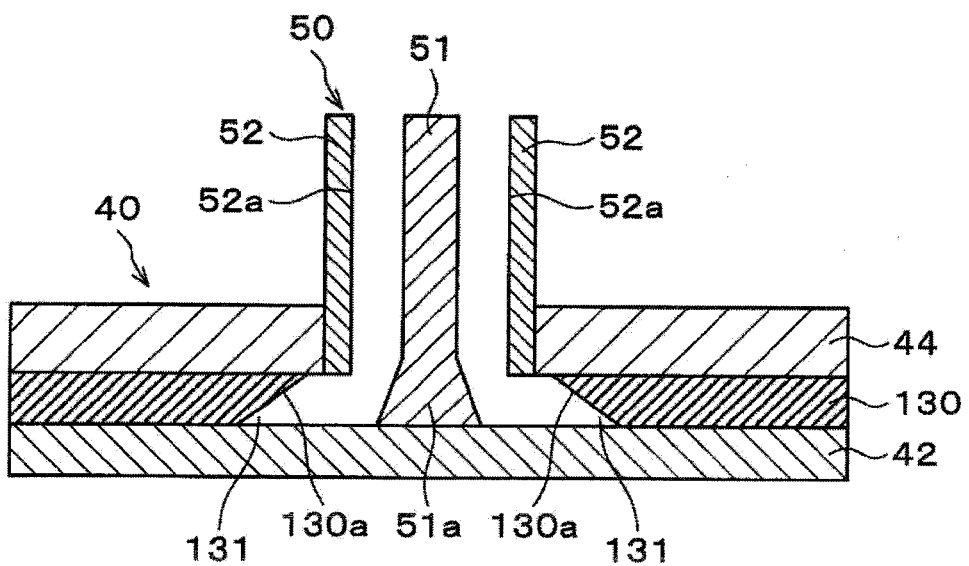
FIG. 4 is a vertical cross-sectional view schematically illustrating configurations of a coaxial waveguide and a slow wave plate as a comparative example.

The inner surface 43a of the slow wave plate 43 extends in a substantially vertical direction. From this point, for example, as illustrated in FIG. 4, when the inner surface 130a of the slow wave plate 130 obliquely extends from the vertical direction, a minute air layer 131 is formed between the inner surface 130a and the slot plate 42. Then, the transmission path of the microwaves transmitted from the coaxial waveguide 50 to the slow wave plate 130 becomes a complicated space and as a result, the microwaves are not appropriately transmitted from the coaxial waveguide 50 to the slow wave plate 130. Therefore, the microwaves are non-uniformly radiated in the circumferential direction in the slow wave plate 130. Whereas, since the inner surface 43a of the slow wave plate 43 of the present exemplary embodiment extends in the approximately vertical direction, the minute air layer is not formed in the transmission path of the microwave and the transmission path of the microwave is simplified from the air layer 70 to the slow wave plate 43 as described above. Therefore, the microwaves may be uniformly radiated in the circumferential direction in the slow wave plate 43. The inventors have found that the same effect may be achieved even if the inner surface 43a of the slow wave plate 43 is in a range of ±5° from the vertical direction.

As described above, in order to uniformly radiate microwaves in the circumferential direction in the slow wave plate 43, it is requested that minute air layers such as, for example, the air layers 111 of FIG. 7, the air layers 121 of FIG. 8, and the air layers 131 of FIG. 4 are not be formed in the transmission path of the microwaves. In other words, the slow wave plate of the present exemplary embodiment which simplifies the transmission path of the microwaves may uniformly radiate the microwave in a circumferential direction.

Figure 5:
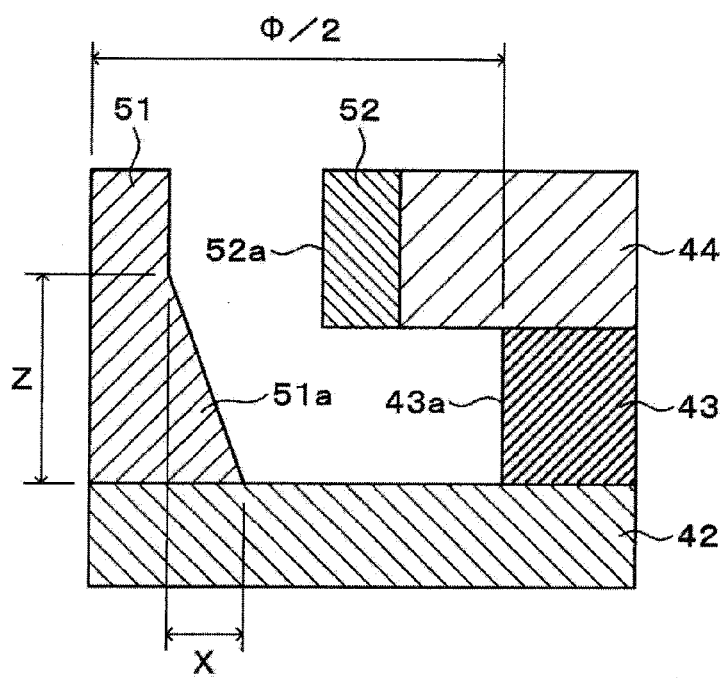
FIG. 5 is an explanatory view illustrating an inner diameter of the slow wave plate and a tapered shape size of the lower end portion of an inner conductor which are conditions of simulation.
Figure 6A:
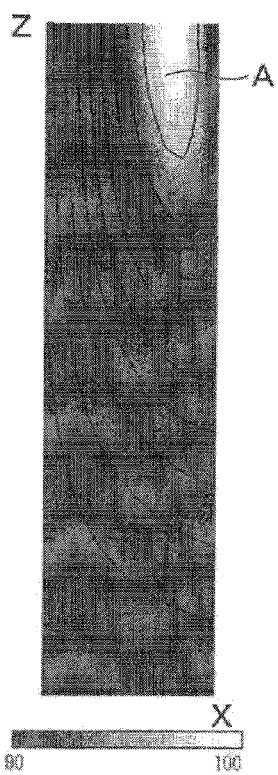
Figure 6B:
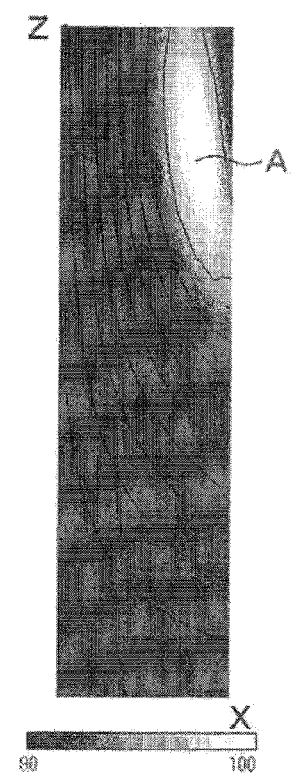
Figure 6C:
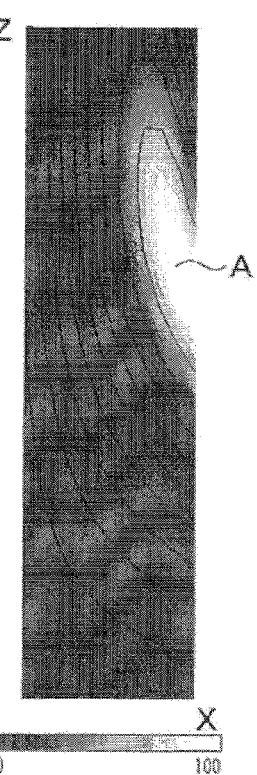

The inner diameter Φ of the slow wave plate 43 illustrated in FIGS. 2 and 3 is determined as follows. A simulation was performed by changing the tapered shape size (the horizontal length X and the vertical length Z) in the lower end portion 51a of the inner conductor 51 illustrated in FIG. 5 and further changing the inner diameter Φ of the slow wave plate 43. The results are illustrated in FIGS. 6A to 6C. Graphs of FIGS. 6A to 6C represent emissivities of microwaves transmitted from the coaxial waveguide 50 to the slow wave plate 43 in the horizontal length X (a horizontal axis) and the vertical length Z (a vertical axis) of the lower end portion 51a of the inner conductor 51. Further, FIGS. 6A to 6C illustrate cases where the inner diameter Φ of the slow wave plate 43 was changed. For example, the inner diameter Φ was 50 mm in FIG. 6A, the inner diameter Φ was 60 mm in FIG. 6B, and the inner diameter Φ was 70 mm in FIG. 6C.

The inner diameter Φ of the slow wave plate 43 is determined such that a predetermined radiation region A where the emissivity of microwaves does not lower than a predetermined emissivity has a maximum area. The predetermined emissivity is set depending on a demanded usage of a product and is, for example, 95%. In the examples of FIGS. 6A to 6C, when the inner diameter Φ is 60 mm, the predetermined radiation region A where emissivity of the microwave is 95% or higher has the maximum area. Thus, the diameter Φ is determined as that for the predetermined radiation region.

In this case, since the predetermined radiation region A where emissivity of the microwave is 95% or higher has the maximum area, the degree of design freedom of the tapered shape size (the horizontal length X and the vertical length Z) in the lower end portion 51a of the inner conductor 51 is increased. That is, for example, even if a processing error of the inner conductor 51 is generated, the emissivity of microwaves is ensured to be 95% or higher, so that the microwaves may be uniformly radiated in the circumferential direction in the slow wave plate 43.

The inner diameter Φ of the slow wave plate 43 is determined to satisfy the following Equation 1. The left side of Equation 1 indicates a change rate of the emissivity of microwaves transmitted from the coaxial waveguide 50 to the slow wave plate 43 with respect to the change of the tapered shape size (the horizontal length X and the vertical length Z) in the lower end portion 51a of the inner conductor 51. The right side of Equation 1 indicates an upper limit of the change rate of the emissivity of microwaves, for example, 10 (%/mm). Further, the upper limit is set by the demanded specification of the product and may be arbitrarily set.

[Equation 1]

$$\sqrt{\left(\frac{\partial P}{\partial x}\right)^2 + \left(\frac{\partial P}{\partial z}\right)^2} \leq 10 \quad (1)$$

P: emissivity of microwaves (%), X: horizontal length of the tapered shape in the lower end portion 51a of the inner conductor 51 (mm), Z: vertical length of the tapered shape in the lower end portion 51a of the inner conductor 51 (mm)

As described above, when the change rate of the emissivity of microwaves is a predetermined value or less, the microwaves are appropriately radiated, regardless of the tapered shape of the lower end portion 51a. In other words, the gap between the lower end portion 51a of the inner conductor 51 and the outer conductor 52 is appropriately secured, so that the microwaves transmitted through the inside of the coaxial waveguide 50 are appropriately reflected from the tapered lower end portion 51a and is appropriately transmitted in the radial direction of the slow wave plate 43.

Next, descriptions will be made on a plasma processing performed on a wafer W by the plasma processing apparatus 1 configured as described above. In the present exemplary embodiment, a plasma film formation processing is performed on the wafer W as described above, to form a SiN film on the surface of the wafer W.

First, the gate valve 12 is opened and the wafer W is carried into the processing container 10. The wafer W is mounted on the mounting table 20 by the elevating pin. In this case, the DC power supply 23 is turned ON to apply a DC voltage to the electrode 22 of the electrostatic chuck 21 and the wafer W is electrostatically attracted onto the electrostatic chuck 21 by Coulomb force of the electrostatic chuck 21. Thereafter, the gate valve 12 is closed and the inside of the processing container 10 is sealed. Then, the exhaust apparatus 33 is operated to reduce the pressure within the processing container 10 to a predetermined pressure, for example, 400 m Torr (=53 Pa).

Next, a processing gas is supplied to the processing container 10 from the processing gas supply tube 60. In this case, the flow rate of Ar gas supplied from the processing gas supply tube 60 is, for example, 750 sccm (ml/min).

As described above, when the processing gas is supplied into the processing container 10, the microwave generator 55 is operated and microwaves having a predetermined power are generated by a frequency of 2.45 GHz in the microwave generator 55. The microwaves are radiated into the processing container 10 through the rectangular waveguide 54, the mode converter 53, the coaxial waveguide 50, and the radial line slot antenna 40. In this case, as described above, the microwaves transmitted from the coaxial waveguide 50 to the slow wave plate 43 are uniformly radiated in the circumferential direction in the slow wave plate 43. Further, the processing gas is turned into plasma with a uniform density in the processing container 10 by the uniform microwaves radiated into the processing container 10, disassociation of the processing gas is progressed in the plasma and a film formation processing is performed on the wafer W by active species generated in this case. Then, the SiN film is formed on the surface of the wafer W.

While the plasma film formation processing is performed on the wafer W, the high frequency power supply 25 may be turned ON, to output high frequency waves with a predetermined power at a frequency of 13.56 MHz. The high frequency waves are applied to the mounting table 20 through the capacitor 24 and an RF bias is applied to the wafer W. In the plasma processing apparatus 1, since the electron temperature of the plasma is maintained to be low, no damage is caused in the film and further, molecules of the processing gas are easily disassociated by the high density plasma, so that the reaction is accelerated. Further, by applying the RF bias in an appropriate range, the ions in the plasma are sucked onto the wafer W, so that densification of the SiN film is improved and a trap in the film is increased.

Thereafter, when the SiN film is grown and a SiN film having a predetermined thickness is formed on the wafer W, the supplying of the processing gas and irradiation of the microwaves are stopped. Thereafter, the wafer W is carried out from the processing container 10, so that a series of plasma film formation processings are terminated.

According to the above exemplary embodiments, the slow wave plate 43 has the above-described structure, so that a minute air layer is not formed in the transmission path of the microwave transmitted from the coaxial waveguide 50 to the slow wave plate 43 and the gap between the lower end portion 51a of the inner conductor 51 and the outer conductor 52 is formed only by the air layer 70. Further, the transmission path of the microwave may be simplified. Therefore, microwaves are appropriately transmitted from the coaxial waveguide 50 to the slow wave plate 43, so that the microwave is uniformly radiated in the circumferential direction in the slow wave plate 43. As described above, since the microwaves are uniformly radiated, an electric field formed by energy of the microwaves is not disturbed. Thus, the density of the plasma generated in the processing container 10 becomes uniform and as a result, the plasma processing may be appropriately performed.

In the above exemplary embodiments, although the present disclosure is applied to the plasma processing for a film formation processing, the present disclosure may be applied to a substrate processing in addition to the film formation processing, for example, to etching processing or plasma processing which performs sputtering. Further, a workpiece processed by the plasma processing of the present invention may be any of a glass substrate, an organic EL substrate, and a substrate for a flat panel display (FPD).

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus that processes a workpiece, the apparatus comprising:

a processing container configured to accommodate the workpiece;

a coaxial waveguide including an inner conductor and an outer conductor where a lower end portion of the inner conductor has a tapered shape of which a diameter increases downwardly, and configured to deliver a microwave generated in a microwave generator into the processing container;

a slow wave plate having an annular shape in a plan view configured to enclose a lower end portion of the inner conductor of the coaxial waveguide with a gap, and adjust a wavelength of the microwave transmitted from the coaxial waveguide;

a slot plate having a flat-panel shape configured to contact with an entire area of the slow wave plate without a gap except for an area with the annular shape and radiate the microwave transmitted from the slow wave plate; and a microwave-transmissive plate configured to contact with an entire area of the slot plate without a gap and introduce the microwave transmitted from the slot plate into the processing container;

wherein the slow wave plate is designed such that an inner surface of the slow wave plate is located more outside than an inner surface of the outer conductor of the coaxial waveguide in a radial direction, and wherein the slow wave plate has an inner diameter determined based on a predetermined value of emissivity of the microwaves, wherein the predetermined value of emissivity is 95% or higher, wherein a change rate of the emissivity of the microwaves with respect to the change of a size of the tapered shape having a horizontal and vertical length of the lower end portion of the inner conductor is less than or equal to another predetermined value.

2. The plasma processing apparatus of claim 1, wherein the slow wave plate is disposed concentrically with the inner conductor.

3. The plasma processing apparatus of claim 1, wherein the inner surface of the slow wave plate extends in a substantially vertical direction.

4. The plasma processing apparatus of claim 1, wherein an inner diameter of the slow wave plate is set to be 60 mm.

* * * * *